United States Patent
Dong et al.

(10) Patent No.: US 7,871,743 B2
(45) Date of Patent: Jan. 18, 2011

(54) GRAY SCALE MASK

(75) Inventors: Min Dong, Beijing (CN); Seongyeol Yoo, Beijing (CN)

(73) Assignee: Beijing Boe Optoelectronics Technology Co., Ltd, Beijing (CN)

( * ) Notice: Subject to any disclaimer, the term of this patent is extended or adjusted under 35 U.S.C. 154(b) by 281 days.

(21) Appl. No.: 12/128,724

(22) Filed: May 29, 2008

(65) Prior Publication Data

US 2009/0068571 A1     Mar. 12, 2009

(30) Foreign Application Priority Data

Sep. 7, 2007     (CN) .................. 2007 1 0121531

(51) Int. Cl.
     *G03F 1/00*     (2006.01)

(52) U.S. Cl. .......................... 430/5; 349/187

(58) Field of Classification Search ............. 430/5, 430/30, 311–313; 349/43, 187; 716/19, 716/21; 438/148
See application file for complete search history.

(56) References Cited

U.S. PATENT DOCUMENTS

| 6,653,028 | B2 * | 11/2003 | Lee et al. ................ 430/5 |
| 6,876,428 | B2 * | 4/2005 | Kwak et al. ............ 349/187 |
| 2005/0074677 | A1 * | 4/2005 | Laidig et al. ............ 430/5 |
| 2007/0037070 | A1 * | 2/2007 | Ohnuma et al. ......... 430/5 |

* cited by examiner

*Primary Examiner*—Mark F Huff
*Assistant Examiner*—Stewart A Fraser
(74) *Attorney, Agent, or Firm*—Ladas & Parry LLP

(57) ABSTRACT

A gray scale mask for fabricating a thin film transistor, comprising: a source mask region; a drain mask region; and a channel mask region between the source mask region and the drain mask region, wherein a plurality of light-blocking bars are arranged regularly in the channel mask region, and the light-blocking bars are perpendicular to a center line of the channel mask region.

12 Claims, 4 Drawing Sheets

GRAY SCALE MASK

BACKGROUND

The present invention relates to a gray scale mask, and particularly, to a gray scale mask used for forming the source/drain layer (S/D layer) of a thin film transistor (TFT).

Currently, in a manufacturing process of a liquid crystal display (LCD) panel, it is needed to repeat thin film deposition, photolithography with a mask, and etching for several times to manufacture an array substrate and a color filter substrate. The array substrate includes a TFT as a switching element for each pixel. A five-mask (5Mask) technology is commonly used to form an array substrate comprising TFTs. With the progress of the manufacturing process, some manufacturers have attempted to employ a four-mask (4Mask) technology. The 4Mask process reduces one masking process compared with the conventional 5Mask process and shortens the process period with low cost. Therefore, the 4Mask process is becoming the mainstream for manufacturing a TFT LCD array substrate.

In the 4Mask process, the masking processes for forming an active layer and for forming a source/drain layer in the 5Mask process are combined into a single one. In the 4Mask process, a gray scale photoresist pattern is formed with a mask having combination of slits and light-blocking bars, and the channel of a TFT is formed by performing two etching processes. FIG. 9 shows a conventional gray scale mask used for the exposure process for forming the source/drain layer. On the gray scale mask, there are provided a source mask region 20 for forming the source of a TFT and a drain mask region 10 for forming the drain of the TFT. An end of the source mask region 20 is located within the drain mask region 10 of U-shape, so that a U-shaped channel region is formed in the TFT after photolithography and etching. As shown in FIG. 9, on the gray scale mask, a light-blocking bar 60 is arranged along the extending direction of the channel in the region where the channel region is to form. Slits 50' are formed between the light-blocking bar 60 and the source mask region 20 and between the light-blocking bar 60 and the drain mask region 10, respectively. Due to the generated double-slit interference, after exposure and development, a gray scale photoresist pattern is obtained, of which a relatively flat gray scale photoresist portion (i.e., a photoresist portion whose height is in proportion to that of the photoresist portions for the source/drain, and the ratio of height between the portions is for example 1/2) is formed in the region where the channel region is to form. With the gray scale mask pattern, a first etching is performed to obtain a source/drain pattern, and after ashing on the photoresist pattern, a second etching can be performed to obtain the desired channel.

However, when an exposure process is performed for the source/drain layer with the mask in which the light-blocking bar is arranged along the U-shaped channel region, the intensity of light obtained with the double-slit interference is shown in FIG. 10. In this case, although a gray scale photoresist pattern is obtained, non-uniform thickness of the photoresist may be generated in a corner portion, central portion, and/or edge portion of the U-shaped channel region due to the non-uniform intensity of the light passing through the slits and may cause projections at the surface of the above portions of the photoresist pattern. These projections may give rise to residues of the active layer or short circuit in the source/drain layer in the channel of the TFT after etching with the gray scale photoresist pattern.

SUMMARY OF THE INVENTION

According to embodiments of the present invention, there is provided a gray scale mask for fabricating a thin film transistor, comprising: a source mask region; a drain mask region; and a channel mask region between the source mask region and the drain mask region, wherein a plurality of light-blocking bars are arranged regularly in the channel mask region, and the light-blocking bars are perpendicular to a center line of the channel mask region.

Further scope of applicability of the present invention will become apparent from the detailed description given hereinafter. However, it should be understood that the detailed description and specific examples, while indicating preferred embodiments of the invention are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Figure 1:
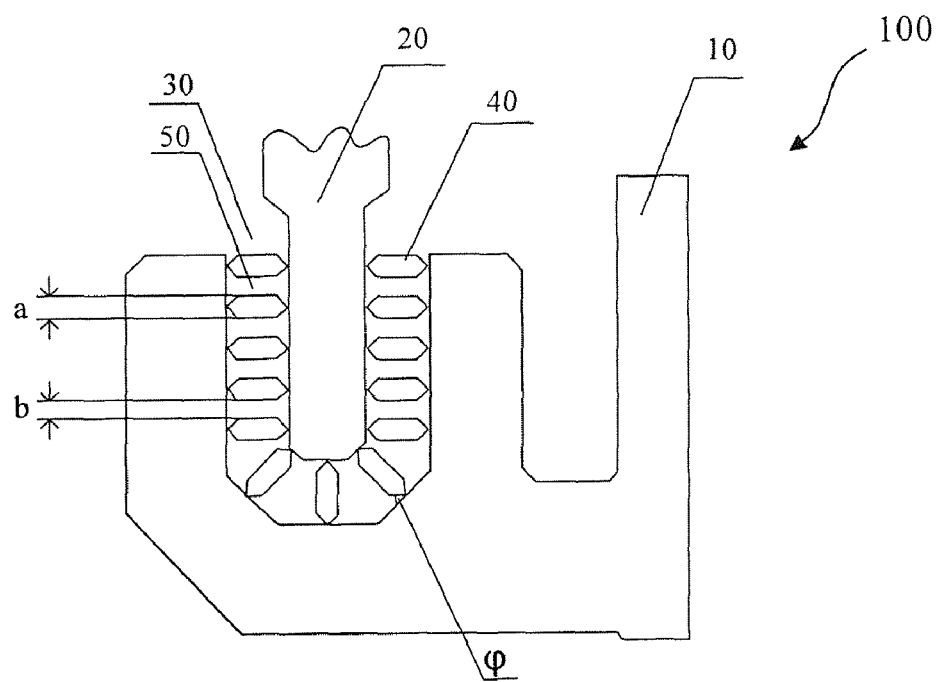
FIG. 1 is a schematic view showing a U-shaped gray scale mask according to an embodiment of the present invention.

FIG. 1 is a schematic view showing a U-shaped gray scale mask according to an embodiment of the present invention. The mask 100 is used to form a TFT on an array substrate of a LCD, and particularly, to form the source/drain and the channel of the TFT.

On the mask 100, there are arranged a source mask region 20 for forming the source of the TFT, a drain mask region 10 for forming the drain of the TFT, and a channel mask region 30 for forming the channel of the TFT between the source mask region 20 and the drain mask region 10. A plurality of light-blocking bars 40 are arranged regularly in the channel mask region 30, and, for example, are perpendicular to the center line of the channel mask region 30.

Figure 2:
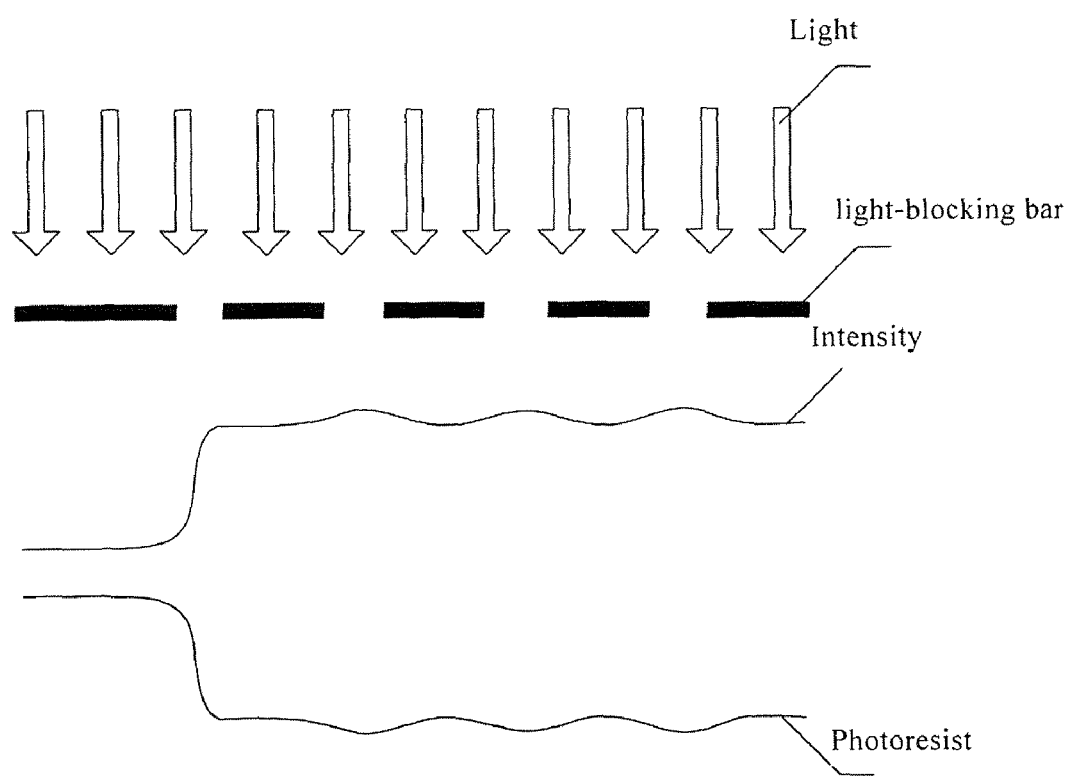
FIG. 2 is a schematic view showing the light intensity produced by the U-shaped gray scale mask of the embodiment.

During a masking process in photolithography, the source mask region 20 and the drain mask region 10 of the gray scale mask 100 are used to form the source and drain of the TFT, respectively. In the mask 100, the plurality of light-blocking bars 40 are regularly disposed to be perpendicular to the center line of the channel mask region 30, and slits 50 are formed between the neighboring light-blocking bars 40. When incident light passes through the light-blocking bars 40 in the channel mask region 30, multiple interferences occur among the light beams. Since the light-blocking bars 40 are regularly arranged, uniform light illumination can be obtained under the mask 100 with the slits 50 and the light-blocking bars 40, as shown in FIG. 2.

In fabrication of the TFT, to form the source/drain and the channel, a semiconductor layer, an ohmic contact layer, and a source/drain metal layer are sequentially deposited on a substrate, and a layer of photoresist is coated on the resultant structure. The photoresist is exposed and developed with the mask 100 to form a gray scale photoresist pattern with difference in height on the surface of the photoresist. The height of the photoresist in the channel region is a specific fraction of that in the source region and the drain region, e.g., lower than the height of the photoresist in the source region and the drain region which has not been exposed. By using the resultant photoresist pattern as an etching mask, the source/drain metal layer, the ohmic contact layer, and the semiconductor layer are etched for the first time, and then an ashing process is performed on the photoresist pattern to remove the photoresist corresponding to the channel region but retain the photoresist corresponding to the source/drain regions. The source/drain metal layer and the ohmic contact layer in the channel region are etched for the second time, so as to form the desired source/drain and channel of the TFT. The surface evenness of the channel region after etching is determined by the surface evenness of the photoresist under the mask with the light-blocking bars.

In the conventional mask, the light-blocking bars are arranged to extend in the direction of the channel for forming the source/drain layer. During the exposure process with the gray scale mask of the present embodiment, there are provided a plurality of slits on the mask to induce multiple interferences of light. The photoresist under mask having the light-blocking bars are illuminated uniformly to reduce the number and size of projections occurring on the photoresist surface, and a photoresist surface with a predetermined height and a high evenness can be obtained. Thus, a second etching is performed after ashing, and the uniformity of the masking process is improved. Also, probability of short circuit occurrence in the source/drain layer due to poor uniformity can be reduced, and a channel with excellent performance can be obtained.

On the basis of the above embodiment, the light-blocking bars on the mask can be formed in a strip shape to ensure a high uniformity of light after multiple interferences. Preferably, to avoid dead angle due to large contact area between the ends of the light-blocking bars and the source/drain mask regions, the ends of the light-blocking bars can be shaped into a wedge angle or a trapezoid, i.e., the ends of the light-blocking bars contact the source/drain mask regions in a form of an angle to some extent, so that the ends of the light-blocking bars contact the source/drain mask regions with a relatively small area. Thus, even when projections are present on the surface of the formed photoresist pattern, since the plurality of light-blocking bars are arranged to cause the projections of the photoresist discretely distributed, and the ends of the light-blocking bars contact the source/drain mask regions in a form of an angle, the source/drain residues formed in the following processes cannot contact the source/drain, which in turn reduces the probability of short circuit occurrence in the source/drain layer and improves the uniformity of the channel. Additionally, the sides of the light-block-ing bars may be formed in a curve. For example, the light-blocking bars may be in an oval or elliptical shape as a whole.

As shown in FIG. 1, as for the U-shaped gray scale mask 100 according to the embodiment, the drain mask region 10 is U-shaped, an end of the source mask region 20 is rectangular and extends into the U-shaped drain mask region 10, so that channel mask region 30 is formed between the internal side of the source mask region 20 and that of the U-shaped drain mask region 10. A plurality of light-blocking bars 40 are arranged in the channel mask region 30 and each is perpendicular to the center line of the channel mask region 30. The ends of the light-blocking bars 40 contact with the source mask region 20 and the drain mask region 10 with an angle φ, that is, an angle between the side of the end of the light-blocking bar 40 and the side of the source mask region 20 or that of the U-shaped drain mask region 10, as shown in FIG. 1. The angle φ is preferably about 20° to 70°. The light-blocking bars have a width "a" of about 1 μm to 3 μm. The light-blocking bars are arranged regularly and have a spacing "b" of about 1 μm to 3 μm therebetween. In a preferred embodiment, the light-blocking bars are formed with a width the same as that of the slits, that is, the width "a" is equal to the spacing "b."

Figure 3:
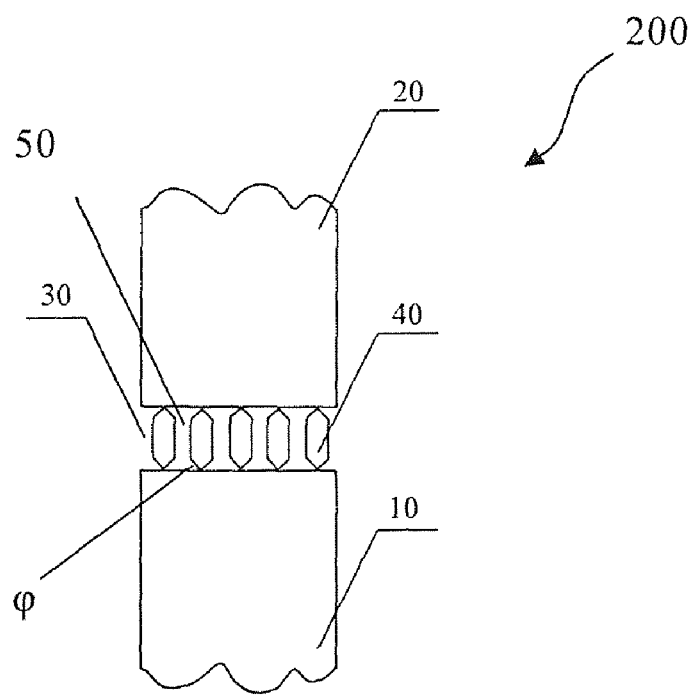
FIG. 3 is a schematic view showing a strip-shaped gray scale mask according to another embodiment of the present invention.

FIG. 3 is a schematic view showing a strip-shaped gray scale mask 200 according to another embodiment of the invention. Both the drain mask region 10 and the source mask region 20 have a rectangular end and the ends are arranged opposite to each other. The channel mask region 30 is formed between the adjacent rectangular ends of the drain mask region 10 and the source mask region 20. A plurality of light-blocking bars 40 are arranged along the direction perpendicular to the opposing ends of the drain mask region 10 and the source mask region 20. The ends of the light-blocking bars 40 can contact with the drain mask region 10 and the source mask region 20 with an angle φ. The angle φ is preferably about 20° to 70°. The light-blocking bars have a width "a" of about 1 μm to 3 μm, and the light-blocking bars are arranged regularly and have a spacing "b" of about 1 μm to 3 μm, similar to the above embodiment. Preferably, the light-blocking bars are arranged with a width the same as that of the slits, that is, the width "a" is equal to the spacing "b."

The manufacturing method of the U-shaped gray scale mask according to the embodiment of the invention is described below with reference to the drawings.

Figure 4:
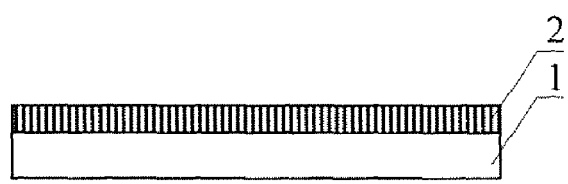
FIGS. 4-8 are schematic cross-sectional views showing the processes for fabricating a gray scale mask according to an embodiment of the invention.

Firstly, as shown in FIG. 4, a layer of metal thin film 2 is deposited on a transparent substrate 1, e.g. a glass substrate, by magnetron sputtering. The metal thin film 2 may be a chromium (Cr) film. Also, the metal thin film 2 can be replaced with a chromium oxide ($CrO_x$) film.

Figure 5:
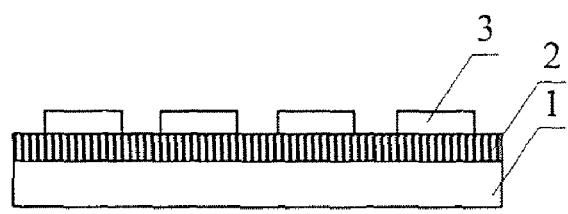
Figure 6:
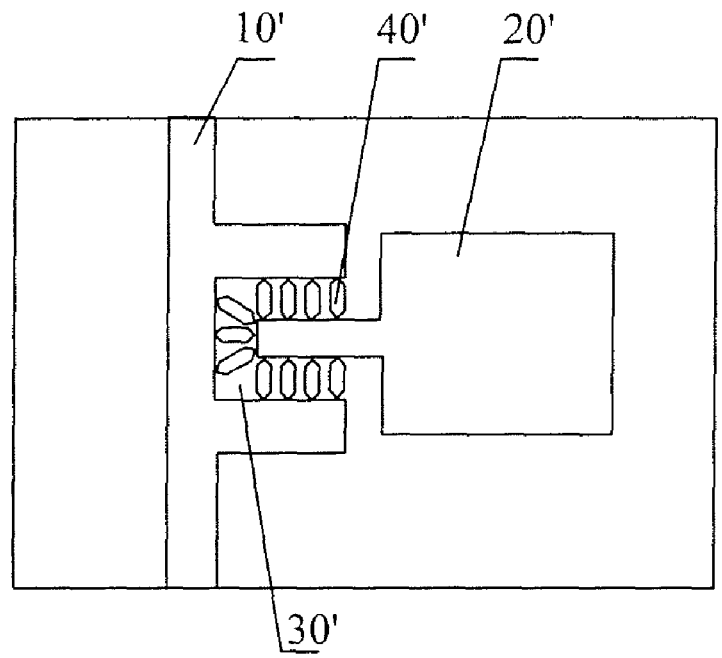

Then, as shown in FIG. 5, a photoresist layer 3 is coated on the metal thin film 2, and the photoresist layer 3 is exposed by laser light to form a specific pattern, as shown in FIG. 6. FIG. 6 is a top view showing the pattern to be formed on the substrate 1. The photoresist pattern includes the following pattern regions: the photoresist drain mask region 10', the photoresist source mask region 20', the photoresist channel mask region 30' between the photoresist drain mask region 10' and the photoresist source mask region 20', and a plurality of photoresist light-blocking bars 40' in the photoresist channel mask region 30'. The photoresist light-blocking bars 40' are arranged perpendicular to the center line of the photoresist channel mask region 30'.

Figure 7:
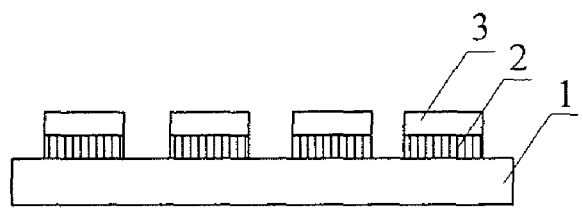

After that, as shown in FIG. 7, an etching process is performed, so that the metal thin film 2 only remains under the photoresist pattern 3.

Figure 8:
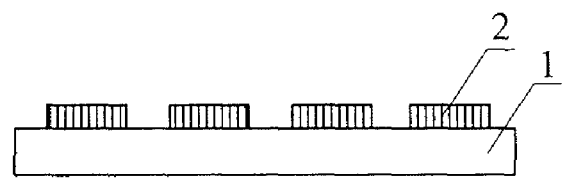
Figure 9:
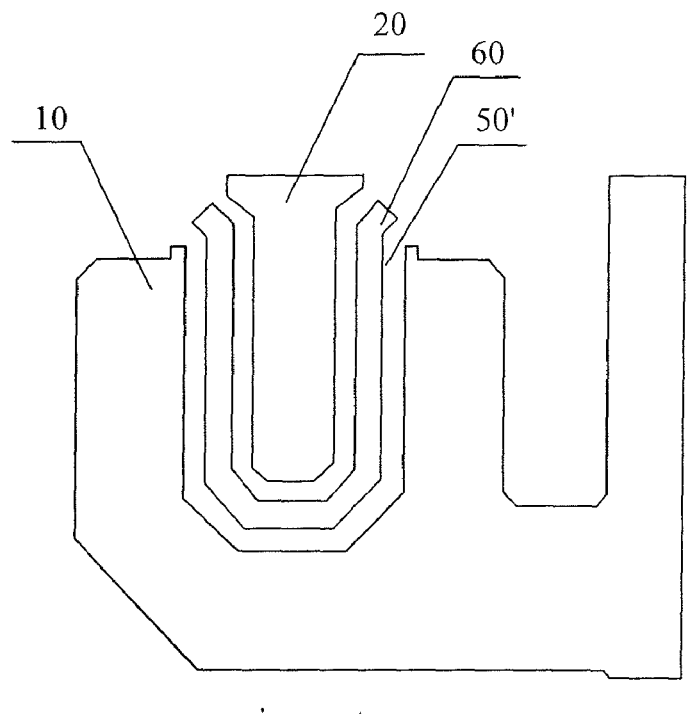
FIG. 9 is a schematic view showing a conventional U-shaped gray scale mask.
Figure 10:
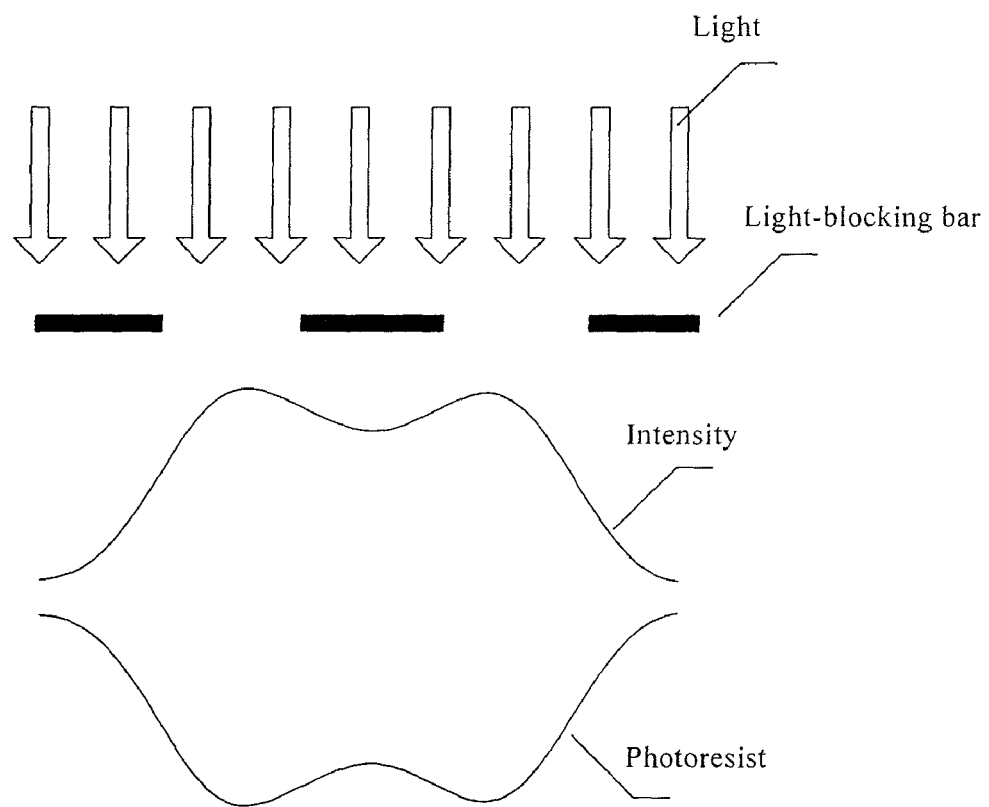
FIG. 10 is a schematic view showing the light intensity produced by the conventional U-shaped gray scale mask.

Finally, as shown in FIG. 8, a stripping-off process is performed, so that the photoresist layer 3 on the glass substrate 1 is striped off to form the mask. The resultant mask includes a drain mask region 10 for forming the drain, a source mask region 20 for forming the source, a channel mask region 30 between the drain mask region 10 and the source mask region 20, and a plurality of light-blocking bars 40 in the channel mask region 30, for example, as shown in FIG. 1. The light-blocking bars 40 are arranged perpendicular to the center line of the channel mask region 30.

The manufacturing process for a strip-shaped gray scale mask is similar to that described above with respect to a U-shaped gray scale mask, except the specific pattern of the photoresist, and the photoresist layer can be formed to have corresponding pattern as necessary.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A gray scale mask for fabricating a thin film transistor, comprising:
   a source mask region;
   a drain mask region; and
   a channel mask region between the source mask region and the drain mask region, wherein a plurality of light-blocking bars are arranged regularly in the channel mask region, and the light-blocking bars are perpendicular to a center line of the channel mask region, each of said source mask region and said drain mask region having a profile and wherein the center line of the channel mask region extends in parallel to the profiles of the source mask region and the drain mask region that face each other.

2. The gray scale mask according to claim 1, wherein ends of the plurality of light-blocking bars which contact the source mask region and the drain mask region are in a form of a wedge angle.

3. The gray scale mask according to claim 2, wherein the ends of the light-blocking bars contact with the source mask region and the drain mask region with an angle in a range of about 20° to 70°.

4. The gray scale mask according to claim 2, wherein the light-blocking bars have a width of about 1 μm to 3 μm.

5. The gray scale mask according to claim 2, wherein the light-blocking bars have a spacing of about 1 μm to 3 μm therebetween.

6. The gray scale mask according to claim 1, wherein the drain mask region is U-shaped, and an end of the source mask region is rectangular and extends into the U shaped drain mask region.

7. The gray scale mask according to claim 1, wherein each of the drain mask region and the source mask region has a rectangular end, and the end of the drain mask region and the end of the source mask region are arranged opposite to each other.

8. The gray scale mask according to claim 1, wherein the light-blocking bars is in a strip shape.

9. The gray scale mask according to claim 1, wherein ends of the plurality of light-blocking bars which contact the source mask region and the drain mask region are in a form of a trapezoid.

10. The gray scale mask according to claim 9, wherein the ends of the light-blocking bars contact with the source mask region and the drain mask region with an angle in a range of about 20° to 70°.

11. The gray scale mask according to claim 9, wherein the light-blocking bars have a width of about 1 μm to 3 μm.

12. The gray scale mask according to claim 9, wherein the light-blocking bars have a spacing of about 1 μm to 3 μm therebetween.

* * * * *